United States Patent [19]
Forsyth

[11] Patent Number: 5,886,344
[45] Date of Patent: Mar. 23, 1999

[54] CORONA DETECTOR WITH NARROW-BAND OPTICAL FILTER

[75] Inventor: Keith W. Forsyth, Philadelphia, Pa.

[73] Assignee: Forsyth Electro-Optics, Inc., Philadelphia, Pa.

[21] Appl. No.: 890,920

[22] Filed: Jul. 10, 1997

Related U.S. Application Data

[60] Provisional application No. 60/024,016, Aug. 12, 1996.

[51] Int. Cl.⁶ .................................................. H01J 40/14

[52] U.S. Cl. .................................... 250/214 VT; 250/226

[58] Field of Search ............................. 250/214 VT, 226, 250/216; 313/532, 539, 103 R

[56] References Cited

U.S. PATENT DOCUMENTS 5,288,992   2/1994   Fohl ........................................ 250/226

*Primary Examiner*—Que T. Le
*Attorney, Agent, or Firm*—William H. Murray; N. Stephan Kinsella

[57] ABSTRACT

A corona detector for detecting a corona associated with a remote object. In one embodiment, the corona detector employs an optical filter having at least one passband centered at a wavelength corresponding with one of the molecular nitrogen emission spectrum second positive emission lines for filtering light from the remote object. A lens operatively coupled to the optical filter forms an image of the remote object, the lens having high transmissivity in the ultraviolet spectrum.

10 Claims, 1 Drawing Sheet

100

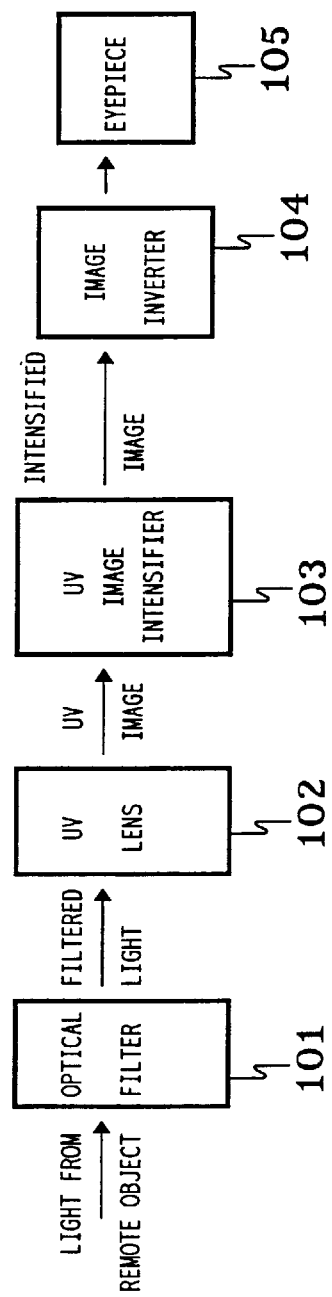
THE FIGURE
100

CORONA DETECTOR WITH NARROW-BAND OPTICAL FILTER

CROSS-REFERENCES TO RELATED APPLICATIONS

This non-provisional U.S. national application, filed under 35 U.S.C. § 111(a), claims, under 35 U.S.C. § 119(e)(1), the benefit of the filing date of provisional U.S. national application Ser. No. 60/024,016, filed under 25 U.S.C. § 111(b) on Aug. 12, 1996, the entirety of which is incorporated herein by reference.

BACKGROUND OF THE INVENTION

1. Field of the Invention

The present invention relates to apparatuses for the detection of electrical corona discharge.

2. Description of the Related Art

High-voltage electrical apparatus often are surrounded by a corona which is discharged by the apparatus when the surrounding air begins to lose insulating qualities. For example, apparatus such as electrical power transmission lines, transformer and substation insulators and bushings, high-voltage power supplies, and the like often have coronas associated therewith when the high voltage of the device causes the surrounding air to begin to conduct rather than insulate. Thus, it is desirable to detect the position and extent of such coronas in order to detect and address equipment failure. These coronas, which are also sometimes referred to as corona discharges, will be referred to herein simply as coronas.

Such coronas are typically most easily visible or detectable by various techniques in darkness. However, there is a need to be able to detect coronas even when there is not complete darkness, i.e. when there is ambient light such as sunlight or artificial indoor light. One technique used to detect and identify the general position of coronas involves the use of ultrasonic microphones. However, ultrasonic microphones do not provide an image and thus cannot precisely locate the source of most corona discharges.

Conventional night-vision equipment which incorporates image intensifier tubes is also sometimes used to locate corona discharges, and can be used to provide an image of a corona, in addition to detecting the corona, unlike ultrasonic techniques. Unfortunately, conventional night-vision equipment has relatively poor sensitivity to the optical energy emitted by a corona discharge, and much better sensitivity to both sunlight and artificial lighting, requiring the equipment to be operated in virtually complete darkness and giving poor sensitivity to corona. This is inconvenient and expensive.

There is, therefore, a need for improved corona detection techniques.

SUMMARY

A corona detector for detecting a corona associated with a remote object. In one embodiment, the corona detector employs an optical filter having at least one passband centered at a wavelength corresponding with one of the molecular nitrogen emission spectrum second positive emission lines for filtering light from the remote object. A lens operatively coupled to the optical filter forms an image of the remote object, the lens having high transmissivity in the ultraviolet spectrum.

BRIEF DESCRIPTION OF THE DRAWINGS

These and other features, aspects, and advantages of the present invention will become more fully apparent from the following description, appended claims, and accompanying drawings in which:

The FIGURE is a block diagram of a corona detector, in accordance with an embodiment of the present invention.

DESCRIPTION OF THE PREFERRED EMBODIMENT

The light emitted by corona discharges in air is heavily concentrated in a relatively small number of very narrow bandwidths, typically a few nanometers (nm) or less. The corona emission light bandwidth wavelengths are primarily in the ultraviolet (UV) spectrum, with very weak emission intensity between the peaks of these bands. Much more than half of the total intensity emitted by a corona discharge is emitted at wavelengths shorter than 380 nm; the strongest emission is typically in a very narrow band centered around 337.1 nm. Additional reasonably strong emission occurs at shorter wavelengths, down to at least 295 nm; other strong emission occurs at other wavelengths, as will be appreciated. This emission spectrum of a corona in ordinary air, and particularly its strong UV spectrum, is almost entirely due to the series of strong emission lines or bands of molecular nitrogen designated by spectroscopists as the "second positive system." Therefore, most of the optical energy emitted by a corona is in the form of UV light, and the corona emission spectrum is thus discontinuous and UV-rich.

In contrast with the discontinuous and UV-rich nature of the corona emission spectrum, most sources of ambient light, including artificial lighting from lamps and sunlight, emit more or less continuous spectra that cover hundreds of nm of bandwidth, and are more intense in the visible and/or near-infrared portions of the spectrum than in the UV spectrum. The intensity of such ambient light drops rapidly at UV wavelengths (shorter than 400 nm).

Conventional night-vision equipment is mainly sensitive to visible and near-infrared light, and thus has poor sensitivity to the UV light generated by coronas. The present invention provides for corona detection by employing an optical filter to select one or more optical wavelengths associated with molecular nitrogen second positive emission lines in the UV spectrum, such that a corona discharge has a relatively strong emission intensity at that wavelength. By using sufficiently narrow bandwidth passbands of the optical filter for each of the UV passband frequencies selected, the ambient or background light is reduced relative to the UV light from the corona. Thus, in the present invention, an optical filter provides one or more sufficiently narrow bandwidth passbands, each of which is centered around one of the UV molecular nitrogen second positive emission lines or around a closely-spaced group of such lines. The present invention therefore allows coronas to be imaged, and thus detected, since the ratio of corona emission light to ambient light is increased, as explained in further detail below with respect to the FIGURE.

Referring now to the FIGURE, there is a block diagram of a corona detector 100, in accordance with an embodiment of the present invention. Corona detector 100 comprises a narrow-band optical filter 101, a UV-transmitting lens 102, a UV image intensifier 103, an image inverter 104, and an eyepiece 105. As will be appreciated, the component parts of detector 100, shown in the FIGURE, are preferably assembled into a external housing (not shown) to form a single corona detector unit. This unit may be held in the hands, or mounted on a tripod or other support, and pointed toward the area of the apparatus to be inspected. Typically, this area will be located 3 to 50 meters away from the observer and the corona detector unit.

Optical filter 101 is preferably a bandpass, comb, or shortpass optical filter having one or more passbands in a selected part or parts of the UV portion of the spectrum and blocking light in the remaining portions of the ultraviolet, visible, and near-infrared spectrum.

UV lens 102 is an image-forming lens capable of passing the wavelengths selected by optical filter 101 with relatively small attenuation. Otherwise, if a UV-transmitting lens 102 were not employed, the UV light passed by optical filter 101 would be effectively filtered out by the lens. (Or, if the lens were in front of the optical filter, the lens would filter the UV light out before reaching the optical filter.) Lens 102 forms an image of a remote object for UV intensifier 103 in response to input light received from the remote object. In one embodiment, UV lens 102 is composed of multiple lens elements, fabricated from materials with low attenuation in the 290–380 nm region, such as silica (quartz), calcium fluoride, magnesium fluoride, sapphire, and/or UV-transmitting optical glasses.

In one embodiment, as illustrated in the FIGURE, UV lens 102 comprises three lens elements in accordance with the classical Petzval portrait lens form, all elements are of fused silica, the relative aperture is f/4.5, the focal length is 100 mm at 337 nm, and the lens covers an image field 18 mm in diameter with a modulation transfer function (MTF) greater than 10% at 30 cycles per mm over at least half the image field. In an embodiment, UV lens 102 is not corrected for chromatic aberration, and may be re-focused if the bandpass of optical filter 101 is changed to match different applications, for example in accordance with changes in ambient light.

In one embodiment, UV lens 102 comprises a focusing mechanism. As will be appreciated, other focal lengths, relative apertures, and other lens specifications may be utilized in alternative embodiments, depending upon the specific application. However, when varying these specifications, UV lens 102 preferably has low attenuation between 280 and 380 nm and an MTF and angular field approximately matching that of UV image intensifier 103.

The wavelengths selected by the present invention are in the UV and are therefore invisible to the human eye. Further, the intensity of the light emitted by corona discharges is relatively low. Therefore, in one embodiment, UV image intensifier 103 is employed to both amplify the filtered light and convert it from UV to visible wavelengths. UV image intensifier 103, in one embodiment, is an image-intensifier tube designed for good sensitivity (i.e. a photocathode responsivity of roughly 10 mA/W or greater) at the UV wavelength(s) appropriate to the application, as discussed above with respect to selection of the bandpass of optical filter 101. In one embodiment, UV image intensifier 103 comprises an input window composed of silica (quartz) or another UV-transmitting optical material, and comprises a photocathode of S-20, bialkalai, or similar UV-sensitive photocathode material. The photocathode diameter of UV image intensifier 103 may be 18 mm, 25 mm, or some other suitable size. The image intensifier power supply may be either internal or external. In one embodiment, UV image intensifier 103 is a "Gen II" proximity-focused microchannel plate intensifier having a photon gain of the order of 1,000–10,000. In an alternative embodiment, UV image intensifier 103 is a "Gen I" tube having lower gain and sensitivity but lower cost than Gen II type intensifiers. UV image intensifier 103 further comprises output screen phosphors, such as P-20 or P43 (green emission) phosphors.

Image inverter 104 receives the output image from UV image intensifier 103, and is used to present an image that is correctly oriented (top to bottom and right to left) when the user looks through eyepiece 105. In one embodiment, image inverter 104 is included as a part of the housing of UV image intensifier 103. In an alternative embodiment, image inverter 104 is not physically included within the image inverter 104 housing, and comprises a fused fiber-optic bundle with a 180 degree twist between input and output, an erecting prism assembly (e.g. Porro pair, Pechan roof, etc.), or an inverting lens relay.

The MTF of image inverter 104 is, in one embodiment, approximately equal to or better than the MTF of UV image intensifier 103, to prevent image degradation, and the field coverage of image inverter 104 is sufficient to cover the UV image intensifier 103 phosphor screen diameter, typically 18 mm or 25 mm.

Eyepiece 105 is preferably of the same general type normally used for amateur astronomy, having a focal length of approximately 20–40 mm and covering most or all of the field of the image inverter 104 output with an MTF roughly matching that of image inverter 104. All components of corona detector 100 are mounted in an enclosed housing (not shown) such that the correct mechanical spacings are maintained and the complete unit can be easily held in the hands and/or mounted on a rigid support such as a camera tripod.

The center wavelength (maximum transmission wavelength) of optical filter 101 and the spectral width of its passband(s) are chosen so as to pass an emission line, or group of lines, from the optical emission spectrum of molecular nitrogen. Preferably, as explained above, the transmitted line(s) are chosen from the optical wavelengths associated with molecular nitrogen second positive emission lines in the UV spectrum. The preferred passband(s) of optical filter 101 thus correspond with one or more relatively strong emission lines, for example, one or more of the spectral lines having wavelength maxima at 380.5 nm (also referred to as the 0,2 line of the molecular nitrogen second positive emission spectrum), 375.5 nm (the 1,3 line), 371.0 nm, 357.7 nm (the 0,1 line), 353.7 nm (the 1,2 line), 337.1 nm (the 0,0 line), 315.9 nm (the 1,0 line), 313.6 nm, 311.7 nm, 297.7 nm (the 2,0 line), 296.2 nm (the 3,1 line), or 295.3 nm (the 4,2 line).

Which spectral lines are selected by optical filter 101 by having passbands encompassing these lines is determined in accordance with the particular application, for example whether the object to be inspected for possible coronas is outdoors or indoors, in sunlight or at nighttime, etc. For many applications such as the inspection of electrical power high-voltage transmission lines and substations, particularly at voltages above 50 kV, it is desirable to be able to locate the corona during ordinary daylight, so as to avoid the inconvenience and expense of working at night. For indoor applications, such as the testing of high-voltage components during manufacture, it is desirable to work with the lights on. Therefore, selection of a narrow optical band in the UV spectrum where the corona emission is strong will substantially increase the ratio of corona emission light to background light, allowing a high-contrast corona image to be produced by a UV-transmitting lens.

In the present invention, one or more passbands may be selected with the optical filter in accordance with the nature of the ambient light. In the case of sunlight, ambient light intensity drops monotonically over the entire UV spectrum, and becomes virtually undetectable at wavelengths shorter than 295 nm due to the absorption of atmospheric ozone. Therefore, selection of the corona emission lines near 295–298 nm for the bandpass of the optical filter will give a larger ratio of corona emission to background in the presence of sunlight than selection of other corona emission wavelengths, such as the emission peak at 337 nm. For bright sunlight, selection of the corona emission lines near 295–298 nm is preferred.

Since the maximum absolute intensity of the corona emission occurs at 337 nm, selection of this wavelength will normally be preferred when the background illumination is either dim sunlight or artificial light. Selection of intermediate lines, such as those near 316 nm, will yield intermediate results.

A bandwidth of approximately 10 nm for the bandpass(es) of optical filter 101 has been found to be useful in obtaining these advantages, but using a bandwidth much broader than 10 nm begins to reduce these advantages (although there may be no detectable difference between the performance with a 10 nm bandwidth bandpass and a 9 or 11 nm bandwidth bandpass). However, making bandwidth(s) of the bandpasses of optical filter 101 narrower can improve the performance significantly for some applications. It has been empirically determined that an optimum filter bandwidth is about 1.0 to 10 nm for indoor applications, and about 0.001 to 0.01 nm for outdoor applications, although the practical lower limit on the bandwidth of commercially-available optical filters at the present time is about 0.1 to 1.0 nm. Therefore, an optical filter bandpass having a bandwidth of 10 nm or less is, in general, preferred.

Thus, in one embodiment, each passband of optical filter 101 has a bandwidth of 0.1 to 10 nm, for selection of one line or a closely-spaced group of lines, where "bandwidth" is defined conventionally to mean the full width of the optical passband measured from the half maximum transmission points, sometimes referred to as full width at half maximum or FWHM. The rejection band of optical 101 filter is preferably chosen to reject (with attenuation at least 20 dB relative to the transmission peak) other light wavelengths within the range of approximately 290 to approximately 1,200 nm. Rejection at wavelengths shorter than 290 nm is not needed because there is very little background (ambient) light at these wavelengths, and rejection at wavelengths longer than 1,200 nm is not needed because UV image intensifiers such as intensifier 103 typically are insensitive to wavelengths longer than roughly 1,000 nm.

The strongest corona emission normally occurs at the 337.1 nm emission line, but the largest ratio of corona emission to ambient background light normally occurs at emission wavelengths shorter than 300 nm. Therefore, the selection of an optimum filter depends on the amount and type of background light for a particular application. For example, optical filter 101 having a passband from about 294–299 nm may be for use in bright outdoor daylight, and a passband centered on 337 nm may be used in dim outdoor light or indoors under artificial light, since sunlight is very rich in UV at wavelengths longer than about 300 nm, whereas artificial light is relatively weak in UV at wavelengths shorter than about 350 nm. In one embodiment, therefore, optical filter 101 is mounted in a removable mount, such that the user can select different filters for different applications (e.g. indoors versus outdoors, bright versus dim ambient light).

In use, UV lens 102 of corona detector 100 is focused so that it forms an image of the electrical apparatus or other remote object to be inspected at the photocathode of UV image intensifier 103. Eyepiece 105 receives the output of image inverter 104 and is preferably focused to provide a focused image of the remote object and any corona, for example to a user's eye looking into eyepiece 105. Since a small amount of UV light within the passband(s) of optical filter 101 will normally be present, a dim image of the remote object will be seen in the eyepiece. If a corona discharge is present, a bright image of this discharge will be seen at the corresponding location on the object being inspected. Empirical testing of the invention confirms that corona discharges invisible to other methods can be detected with useful sensitivity at useful ranges. If necessary, the user may select from a variety of narrow-band optical filter(s) to obtain the maximum contrast of corona against background, or the maximum sensitivity for detecting weak coronas in dim background light.

Thus, in the present invention, by combining at least one narrow filter centered on one of the strong lines of the molecular nitrogen emission spectrum (especially the 0,0 line of the second positive system), the corona image brightness is reduced only slightly compared with the use of a broadband UV filter, whereas the background (interfering) light from other sources is reduced by a much greater amount, thus greatly increasing the signal-to-background ratio and making it possible to view corona at much greater levels of background illumination.

As will be appreciated, although the present embodiment disclosed herein contains an image inverter 104 and eyepiece 105 to allow for human viewing, in alternative preferred embodiments other detection methods may be employed. For example, in one alternative embodiment, an electronic detector can be positioned to receive the image of UV image intensifier 103 (or incorporated therein), and suitably configured to be able to automatically detect any corona present in the image. Charge-coupled device (CCD) arrays or other solid-state electronic image detectors such as complementary metal oxide semiconductor (CMOS) imager technology may also be employed instead of an eyepiece and inverter to capture the image on the phosphor screen of UV image intensifier 103. The image so captured may then be displayed on a monitor for viewing by human user or processed by an image processor configured to automatically detect coronas.

As will be appreciated, although corona detector 100 of the FIGURE is illustrated with optical filter 101 situated in front of UV lens 102, so that light from the remote object passes through optical filter 101 before passing through UV lens 102, in alternative embodiments, UV lens 102 may be situated in front of optical filter 101, or optical filter 101 may be situated within UV lens 102.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. An apparatus for detecting a corona associated with a remote object, comprising:
   (a) an optical filter having at least one passband centered at a wavelength corresponding with one of the molecular nitrogen emission spectrum second positive emission lines in ultraviolet spectrum for filtering light from the remote object; and
   (b) a lens operatively coupled to the optical filter and for forming an image of the remote object, the lens having high transmissivity in the ultraviolet spectrum.

2. The apparatus of claim 1, wherein the optical filter is positioned in front of the lens so that the lens receives light filtered by the optical filter.

3. The apparatus of claim 1, wherein the passband of the optical filter has a bandwidth of 10 nanometers (nm) or less.

4. The apparatus of claim 1, wherein the wavelength is approximately 337.1 nm.

5. The apparatus of claim 1, wherein the wavelength is approximately 315.9 nm.

6. The apparatus of claim 1, wherein:

the passband of the optical filter has a bandwidth of 10 nm or less; and the passband of the optical filter is centered at a wavelength so that the optical filter passes light at wavelengths of 357.7 nm. 353.7 nm or 357.7 nm and 353.7 nm.

7. The apparatus of claim 1, wherein:

the passband of the optical filter has a bandwidth of 10 nm or less; and the passband of the optical filter is centered at a wavelength so that the optical filter passes light at wavelengths of 380.5 mn, 375.5 nm or 380.5 nm and 375.5 nm.

8. The apparatus of claim 1, wherein:

the passband of the optical filter has a bandwidth of 10 nm or less; and the passband of the optical filter is centered at a wavelength so that the optical filter passes light at wavelengths of 297.7 nm, 296.2 nm, 295.3 nm or 297.7 nm, 296.2 nm, and 295.3 nm.

9. The apparatus of claim 1, further comprising:

(c) an image intensifier tube having high sensitivity in the ultraviolet portion of the spectrum, for amplifying the image received from the lens and filtered by the optical filter and for converting the image from UV wavelengths to wavelengths visible by humans to provide an amplified, converted image.

10. The apparatus of claim 9, further comprising:

(d) an image inverter for inverting the amplified, converted image provided by the image intensifier tube to provide an inverted image; and (e) an eyepiece for viewing the inverted image provided by the image inverter.

* * * * *